US006350388B1

(12) United States Patent
Knappenberger et al.

(10) Patent No.: US 6,350,388 B1
(45) Date of Patent: Feb. 26, 2002

(54) METHOD FOR PATTERNING HIGH DENSITY FIELD EMITTER TIPS

(75) Inventors: Eric J. Knappenberger, Meridian; Aaron R. Wilson, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/377,256

(22) Filed: Aug. 19, 1999

(51) Int. Cl.[7] ............................ B44C 1/22; H01L 21/00

(52) U.S. Cl. ............................... 216/42; 216/2; 216/11; 216/24; 216/67; 216/79; 438/717; 438/719; 438/725

(58) Field of Search ................................ 216/2, 11, 12, 216/24, 41, 42, 47, 49, 51, 67, 79; 438/689, 712, 713, 717, 719, 723, 725, 743, 745, 756

(56) References Cited

U.S. PATENT DOCUMENTS

| | | | | |
|---|---|---|---|---|
| 4,407,695 A | | 10/1983 | Deckman et al. | |
| 5,391,259 A | | 2/1995 | Cathey et al. | |
| 5,399,238 A | | 3/1995 | Kumar | |
| 5,510,156 A | | 4/1996 | Zhao | |
| 5,676,853 A | | 10/1997 | Alwan | |
| 5,695,658 A | | 12/1997 | Alwan | |
| 5,817,373 A | | 10/1998 | Cathey et al. | |
| 6,051,149 A | * | 4/2000 | Frendt | 216/42 |
| 6,010,831 A | * | 6/2000 | Hatakeyama et al. | 216/11 X |
| 6,126,845 A | * | 10/2000 | Cathey et al. | 216/42 X |

* cited by examiner

*Primary Examiner*—William A. Powell
(74) *Attorney, Agent, or Firm*—TraskBritt

(57) ABSTRACT

A method of forming a pattern in a layer of material on a substrate, comprising providing a plurality of spheres, covering the layer on the substrate with the plurality of spheres to form a mask, reducing the diameter of at least one sphere of the plurality of spheres, etching the layer on the substrate using the at least one sphere having a reduced diameter as a mask, and etching the substrate.

44 Claims, 3 Drawing Sheets

METHOD FOR PATTERNING HIGH DENSITY FIELD EMITTER TIPS

BACKGROUND OF THE INVENTION

1. Field of the Invention

The present invention is directed to the formation of a high density pattern for field emitter tips for field emission display (FED) devices. More specifically, the present invention is directed to a method of formation of a high density pattern for field emitter tips for FED's using microspheres and/or nanospheres.

2. State of the Art

Field emission display (FED) devices are of the type of flat panel display in which a baseplate with a generally planar emitter substrate is juxtaposed to a faceplate with a substantially transparent display screen. The baseplate has a number of emitters formed in the emitter substrate that project from the emitter substrate towards the faceplate. The emitters are typically configured into discrete emitter sets in which the bases of the emitters of each emitter set are commonly connected. The baseplate also has an insulator layer formed on the emitter substrate and an extraction grid formed on the insulator layer. A number of holes are formed through the insulator layer and extraction grid in alignment with the emitters to open the emitters to the faceplate. In operation, a voltage differential is established between the extraction grid and the emitter to extract electrons from the emitters.

The display screen of the faceplate is coated with substantially transparent conductive material to form an anode, and the anode is coated with a cathodoluminescent layer. The anode draws the electrons extracted from the emitters through the extraction grid and the cathodoluminescent layer of material. As the electrons strike the cathodoluminescent layer, light emits from the impact site and travels through the anode and the glass panel of the display screen. The emitted light from each of the areas becomes all or part of a picture element.

In field emission displays, it is desirable to have a bright display at each picture element thereof in response to the emitted electrons from the emitters in the emitter set. The brightness at each picture element of a field emission display depends upon the density of the emitters in the emitter sets corresponding to each picture element. It is desirable to have a constant emitter density from one emitter set to another and from one area of the emitter set to another therein. It is further desirable to have the emitters spaced the same distance apart from other emitters in the same emitter set, and to have the emitters of each emitter set substantially the same size and overall shape.

One method for forming emitters is using photolithographic techniques. However, it is difficult to form conically shaped emitters using photolithographic techniques in high densities and over large areas using photolithographic techniques. Therefore, it is desirable to have an easily reproducible technique to form high densities of emitters over large-areas for any desired size of field emission displays.

In another method of forming emitters for field emission displays, illustrated in U.S. Pat. No. 4,407,695, a large area lithographic mask is produced on the surface of a substrate by coating the substrate with a monolayer of colloidal particles such that the particles are fixed to the substrate. Depending upon the disposition technique used, the colloidal particles may be arranged on the surface of the substrate in either a random or ordered array. The array of particles can then be used as a lithographic mask and the random or ordered array can be transferred to the substrate using a suitable etching process. Alternately, the lithographic mask may be used as a deposition mask. The emitters are formed by randomly distributing a number of beads on a hard oxide layer that has been deposited over the emitter substrate.

As illustrated in U.S. Pat. No. 5,399,238, sharp submicron emitter tips for field emission displays are formed without requiring photolithography. Vapor deposition is used to randomly locate discrete nuclei to form a discontinuous etch mask. The nuclei are preferably non-polymerized with a relatively high melting point to assure that an ion etch produces pyramid shaped tips with a suitable enhancement factor. In one instance, an etch is applied to low work function material covered by randomly located nuclei to form emission tips in the low work function material. In another instance, an etch is applied to a base material covered by randomly located nuclei to form tips in the base material which are then coated with low work function material to form emission tips. Diamond is the preferred low work function material.

As illustrated in U.S. Pat. No. 5,676,853, a mask and method of making the mask comprises distributing a mixture of mask particles and spacer particles across a layer of material on a semiconductor wafer. The spacer particles space the mask particles apart from one another to prevent the mask particles from clustering together and to control the distance between mask particles. The mixture is preferably deposited onto the layer of material to form a substantially contiguous monolayer of mask and spacer particles across the surface of the wafer. The spacer particles are then selectively removed from the surface to the layer such that the mask particles remain on the layer in a pattern of spaced apart masked elements. The spacer and mask particles are preferably made from material with different etching selectivities that allow the spacer particles to be selectively etched from the wafer. In other instances, the physical differences may allow the spacer particles to be removed by selectively breaking a bond between the spacer particles and the surface layer, or by selectively evaporating, sublimating, or melting the spacer particles from the layer of material. The spacer particles and the underlying layer of material upon which the spacer particles are deposited are preferably made from materials that may be selectively etched without etching the mask particles. The spacer particles and the underlying layer of material may accordingly be etched in a single process step to form a desired pattern of island-like elements under the mask particles.

As illustrated in U.S. Pat. No. 5,510,156, a method is disclosed wherein the deposition of latex spheres on a sacrificial layer on a substrate, shrinking of the spheres, depositing a metal over the spheres, dissolving the spheres, etching the substrate through the openings formed by removing the spheres, removing the remaining metal, and depositing the desired microstructure material over the sacrificial layer are used to form a textured top surface of the sacrificial layer.

Illustrated in U.S. Pat. No. 5,695,658, a non-photolithographic, physical patterning process is described for the selective etching of a substrate. The process comprises electrostatically charging liquid droplets which are selectively etchable with respect to the substrate, dispersing the droplets onto the substrate in a pattern, and etching the substrate using the droplets as a mask.

In yet another instance, self-assembled polystyrene beads whose diameter can be arbitrarily reduced by reactive ion etching are used to produce a hole array on a silicon substrate which is subsequently filled with material. The beads may have a diameter to allow the formation of a nanostructure array. Alternately, latex beads may be used rather than polystyrene beads.

In another instance, micron and sub-micron holes are formed in field emitter displays which use microspheres to bring parallel beams of ultraviolet radiation into numerous foci on a photoresist which is used as a mask.

In all the described prior art processes, none provides a simple, non-photolithographic process for the manufacture of emitters for a field emission display using a minimum of process steps wherein a high density of emitters in the emitter set is of substantially equal spacing from adjacent emitters and of substantially equal height. Therefore, a need exists for such a process for the forming of a high density of emitters in the emitter set for a field emission display.

SUMMARY OF THE INVENTION

The present invention is directed to a method of formation of a high density pattern for field emitter tips for FED's using microspheres or nanospheres. The present invention includes a method of forming a pattern in a layer of material on a substrate, comprising providing a plurality of spheres, covering the layer on the substrate with the plurality of spheres to form a mask, reducing the diameter of at least one sphere of the plurality of spheres, etching the layer on the substrate using the at least one sphere having a reduced diameter as a mask, and etching the substrate.

BRIEF DESCRIPTION OF THE DRAWINGS

The present invention will be better understood with reference to the following drawings when taken in conjunction with the description thereof.

DETAILED DESCRIPTION OF THE INVENTION

Figure 1:
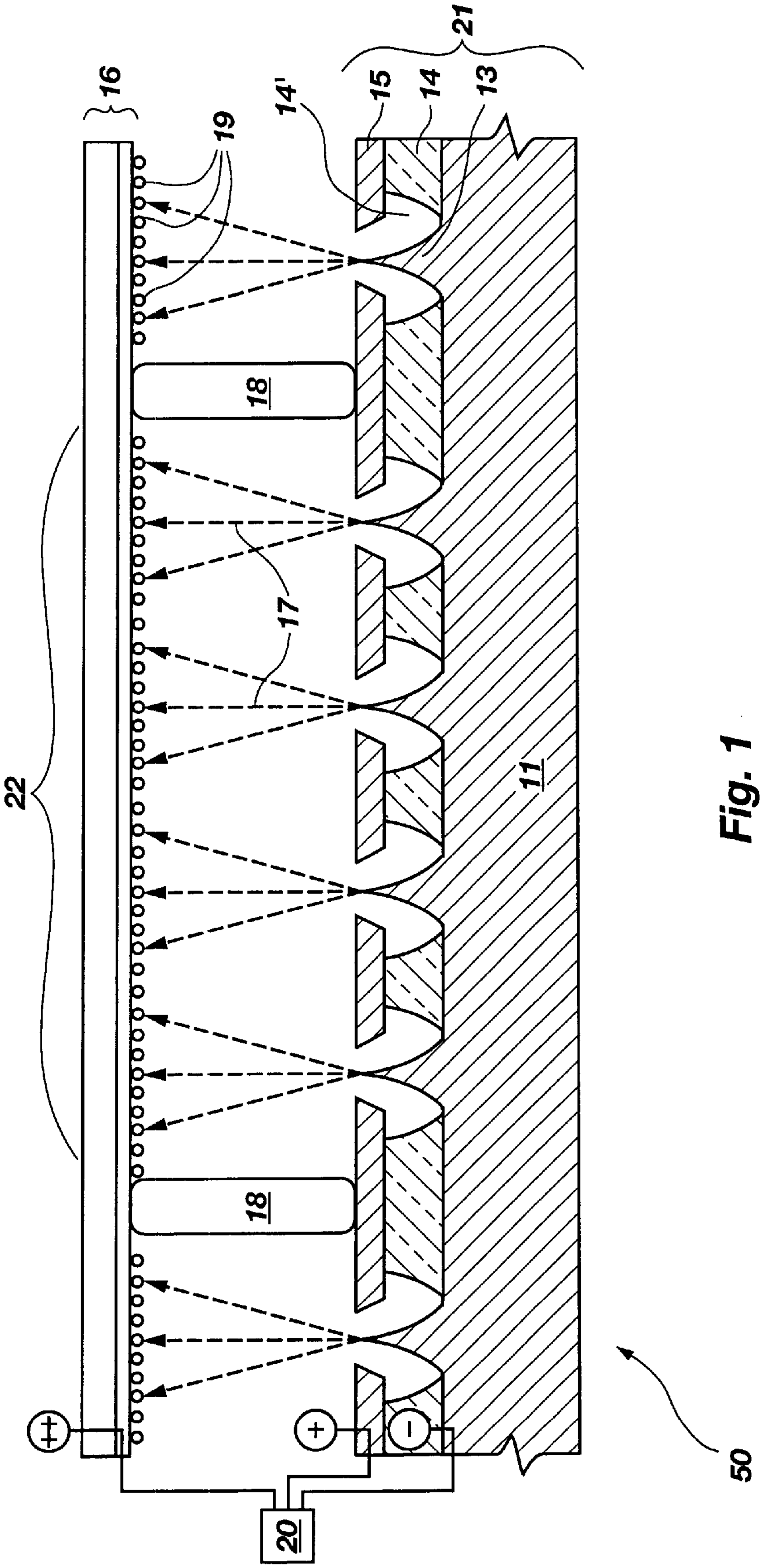
FIG. 1 is a schematic cross-section of a typical field emission display having micro-tips formed according to the process of the present invention.

Referring to drawing FIG. 1, a representative field emission display 50 employing a display segment 22 is depicted. Each display segment 22 is capable of displaying a pixel of information, or a portion of a pixel, as, for example, one green dot of a green/red/blue full-color triad pixel. Preferably, a single crystal silicon layer serves as a substrate 11. Alternately, amorphous silicon deposited on an underlying substrate comprised largely of glass or other combination may be used so long as a material capable of conducting electric current is present on the surface of a substrate so that it can be patterned and etched to form micro-cathodes 13.

At an emission site of a field emission display 50, a micro-cathode 13 (emitter or tip) has been constructed on a substrate 11. The micro-cathode 13 is a protuberance which may have a variety of shapes, such as pyramidal, conical, or other geometry which has a fine micro-point for the emission of electrons therefrom. Surrounding the micro-cathode 13 is a grid structure 15. When a desired voltage differential, through source 20, is applied between the micro-cathode 13 and grid 15, a stream of electrons 17 is emitted (shown in dotted lines) toward phosphor 19 coated on an anode screen forming a faceplate 16. The micro-cathode 13 is formed integrally with the substrate 11. Alternately, the micro-cathode may be formed on a variety of layered and non-layered substrates and materials. Grid 15 serves as a structure for applying an electrical field potential to its respective micro-cathode 13. A dielectric insulating layer 14 is deposited on the conductive micro-cathode 13, the insulating layer 14 having openings 14' therein at the field emission site locations.

Support structures 18 are disposed between an electrode faceplate 16 and a baseplate 21 to support the atmospheric pressure which exists on the faceplate 16 as a result of the vacuum created between baseplate 21 and faceplate 16. It is important to have uniform circular etch masks in a high density uniform pattern for the etching process of forming the micro-cathode 13 on the substrate 11, the density, sharpness, and uniformity of the micro-cathode 13 affecting the clarity and/or resolution of the field emission display 50. The baseplate 21 comprises a matrix of an addressable array of cold micro-cathode emission structures 13, the substrate 11 on which the emission structures are formed, the insulating layer 14, and the anode grid 15.

While many suitable substrate materials 11 may be used, a preferred substrate material 11 is a 14–21 ohms-cms P-type 1-0-0 single crystal silicon material for the formation of the micro-cathode 13.

Figure 2:
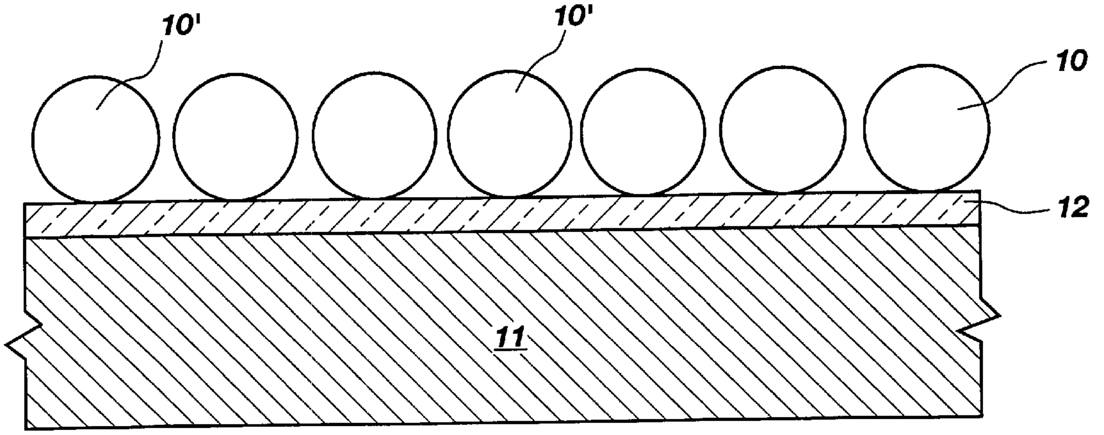
FIG. 2 is a schematic cross-section of a layered substrate having spheres disposed thereon according to the present invention.

In the process of the present invention, the mask dimensions, the balancing of the gases, and parameters in the plasma etch will enable the manufacturer to determine and thereby control the dimensions of the micro-cathode 13. Referring to drawing FIG. 2, the substrate 11 is illustrated having a coating 12 thereon and a plurality of spheres 10 located on the coating 12. Of the plurality of spheres 10, some spheres 10' have a diameter smaller or larger than other spheres 10 due to the variation of the diameter of the spheres 10 during manufacturing processes and the range of sizes of spheres 10 relating to a nominal size thereof, such as a microsphere having a nominal diameter of two (2) microns may vary in diameter from 2.5 microns to 1.5 microns in diameter while still being referred to as a 2 micron diameter microsphere. The substrate can be amorphous silicon overlying glass, polysilicon, or any other suitable material from which the micro-cathode 13 can be fabricated. The coating 12, which is used as a hard mask for the forming of the micro-cathode 13, is preferably of silicon dioxide having a thickness of approximately 0.2 $\mu$m, the composition and dimensions of the mask formed by coating 12 on the substrate 11 affecting the ability of the mask areas of coating 12 to remain balanced at the apex of the micro-cathode 13, and to remain centered on the apex of the micro-cathode 13 during the overetch thereof. "Overetch" refers to the time period when the etch process is continued after a substantially full undercut is achieved. “Full undercut” refers to the point at which the lateral removal of material is equal to the original lateral dimension of the mask formed of the coating 12. The spheres 10 are preferably polystyrene having a diameter in the microsphere and/or nanosphere range. Further, the spheres 10 may be of latex material, or any suitable readily available material for use, such as silicon spheres having a metal base, etc. However, since the brightness, clarity, and/or resolution of the field emission display is dependent upon the density and uniformity of the micro-cathode 13, the smallest diameter sphere is preferred to be used.

As previously stated, the spheres 10 have substantially the same diameter with a typical variation thereof due to variation of the manufacture and grading of the spheres into diameter size ranges. The spheres 10 are applied to the substrate 11 having a coating 12 thereon as a substantially uniform monolayer without clustering or clumping of the spheres 10 with individual spheres 10 being as evenly spaced from one another as possible for a substantially uniform layer having as few discontinuities or holes therein with the individual spheres 10 having their peripheries substantially abutting to form a substantially uniform, dense monolayer of spheres. The spheres 10 may be applied to the substrate 11 having coating 12 thereon as spheres 10 suspended in a volatile liquid, dispensed onto the substrate 11 while the substrate is rotating, and the liquid evaporated, leaving the spheres 10 as a substantially monolayer of spheres. A suitable volatile liquid is water and/or alcohol. Alternately, the spheres 10 may be dry dispensed onto the substrate 11 having coating 12 thereon using an air jet or other gas to propel the spheres towards the coating 12 with the spheres 10 and 10' settling on the coating 12 to form a substantially contiguous monolayer layer with their peripheries abutting thereon. Further, if desired, the substrate 11 having coating 12 thereon may be electrically charged or have areas thereof electrically charged to attract and retain the spheres 10 as a substantially monolayer thereon to form the display segments 22 (see FIG. 1) on the substrate 11.

Figure 3:
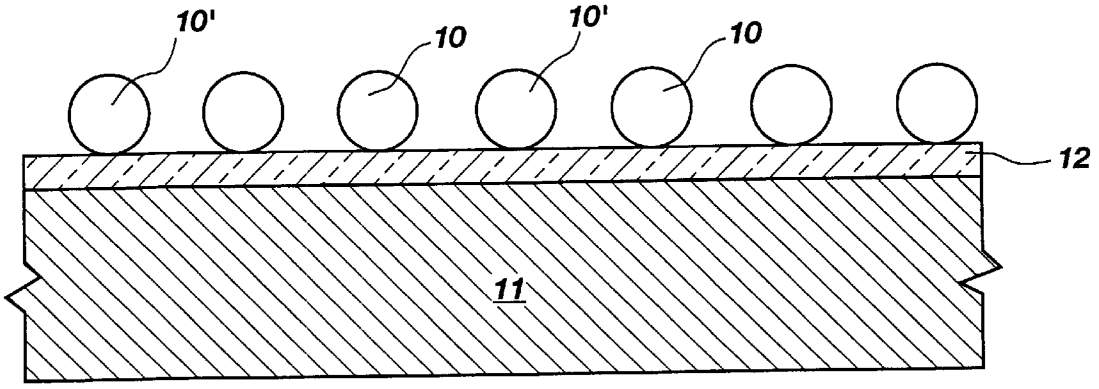
FIG. 3 is a schematic cross-section of the layered substrate of FIG. 2 after the spheres have been reduced in size according to the present invention.

Referring to drawing FIG. 3, the spheres 10 have been reduced, or shrunk, in diameter by the oxidation thereof using a reactive ion etch process, such as a reactive ion etch process using oxygen gas. In this manner, the spheres 10 are no longer abutting each other but are substantially uniformly spaced substantially as a monolayer on the coating 12 on the substrate 11. It should be noted that although the spheres 10 are of slightly differing diameter, as the spheres 10 are reduced in diameter during the etching process, a small change in the diameter of a sphere greatly reduces the volume of the sphere, thereby creating the space between the spheres. For example, when using spheres 10 having a diameter of 2 microns and subsequently reduced to a diameter of 1.6 to 1.0 microns, a 4/8/10 fold increase in the number and density of potential micro-cathodes 13 (see FIG. 1) results over a comparable photolithography process of forming micro-cathodes.

Figure 4:
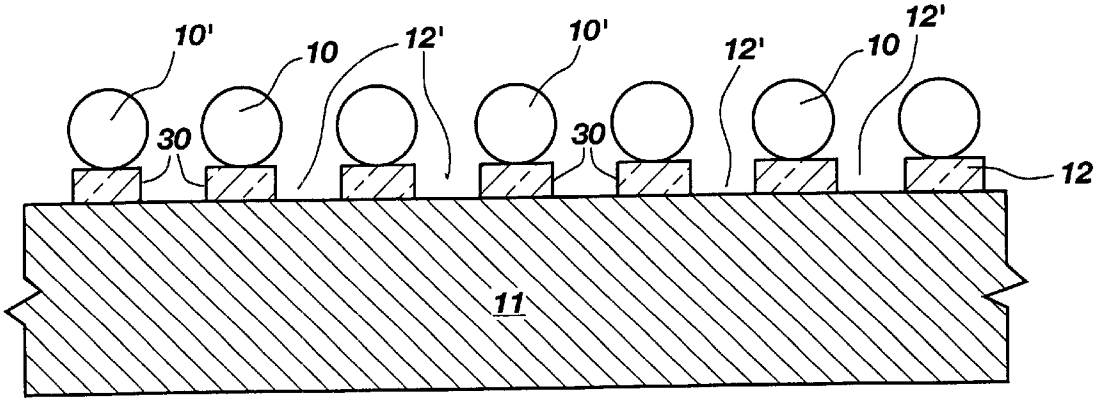
FIG. 4 is a schematic cross-section of the layered substrate of FIG. 3 after the masking layer has been etched according to the present invention.

Referring to drawing FIG. 4, after the spheres 10 have been reduced in diameter, an anisotropic etch using suitable well known gases in a reactive ion etching process is performed on the coating of silicon dioxide 12 using the spheres 10 as a mask to form substantially circular openings 12' in the coating 12, each circular opening 12' having a substantially vertical sidewall 30 thereon as a result of the anisotropic etch of the coating 12. The remaining coating 12 located beneath each reduced diameter sphere of the spheres 10 being a substantially circular island-like area having a diameter substantially the same as the diameter of the reduced diameter sphere 10. When polystyrene or latex spheres 10 are used, a suitable well known anisotropic etch chemistry selective to silicon oxide includes, but is not limited to: $CF_4$, $CHF_3$, and He.

Figure 5:
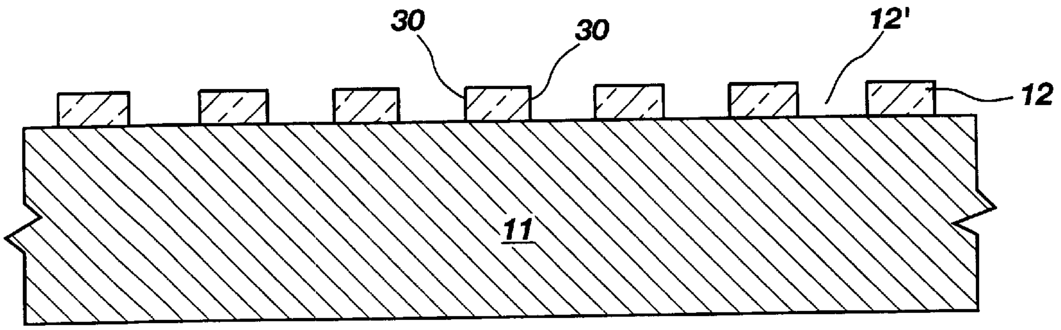
FIG. 5 is a schematic cross-section of the layered substrate of FIG. 4 after the removal of the spheres from the etched masking layer according to the present invention.

Referring to drawing FIG. 5, the substrate 11 is illustrated having the substantially circular island-like areas of the coating 12 thereon being used as a mask for the etching process with the spheres 10 removed from the coating 12. The spheres 10 may be removed from the substrate 11 having the substantially circular island-like areas of the coating 12 formed thereon using typical photoresist removal techniques, such as chemicals, etches, etc.

Figure 6:
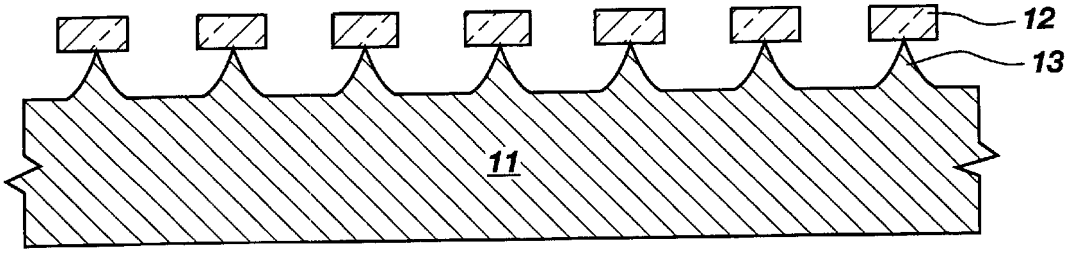
FIG. 6 is a schematic cross-section of the layered substrate of FIG. 5 after an isotropic etch according to the present invention.

Referring to drawing FIG. 6, the substrate 11 is illustrated after the silicon etch step to form the micro-cathode 13. Typically, a plasma etch with selectivity to the etch mask formed by the substantially circular island-like areas of the coating 12 is employed to form the micro-cathode 13; preferably, in the case of a silicon substrate 11, a plasma containing a fluorinated gas, such as $SF_6$, $NF_3$, or $CF_4$, in combination with a chlorinated gas, such as HCl or $Cl_2$, is used. Most preferably, the plasma comprises a combination of $NF_3$ and $Cl_2$, having an additive, such as helium.

The etch continues until all of the micro-cathodes 13 forming on the substrate 11 have been completely undercut the substantially circular island mask areas of coating 12, the parameters for the etching process being well known and understood, such as illustrated in U.S. Pat. No. 5,391,259, which is incorporated herein by reference. The etch is continued until a full undercut is obtained for the micro-cathode 13 with minimal change to the functional shape of the micro-cathode 13 until substantially all micro-cathodes 13 have a substantially identical shape.

Figure 7:
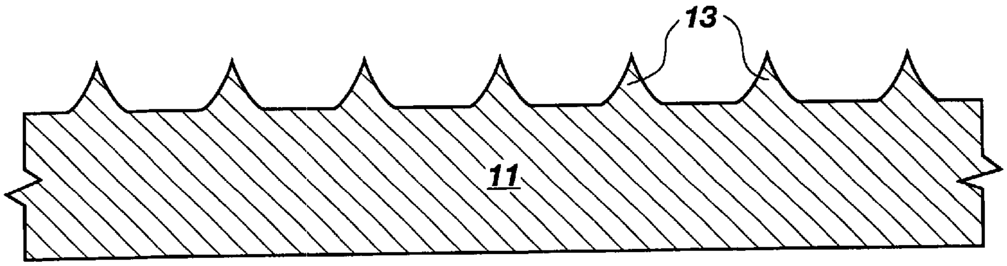
FIG. 7 is a schematic cross-section of the layered substrate of FIG. 6 after the masking layer has been removed according to the present invention.

Referring to drawing FIG. 7, after the tips forming the micro-cathodes have been formed to the desired dimensions, the mask areas of coating 12 are removed with the micro-cathode 13 remaining as illustrated. The mask areas of coating 12 can be stripped by any well-known method, such as a wet etch using a hydrofluoric acid (HF) solution or other HF containing mixture.

It can be seen from the foregoing that, in contrast to the prior art processes, the present invention is used to form a high density of uniform shape and height micro-cathodes in a substrate for use in a field emission display through a simple process of using few process steps and without the use of lithography. The density of the micro-cathodes is determined by the diameter of the spheres, and their reduced diameter, used to form a mask for the etching of the micro-cathodes.

From the foregoing, it will be appreciated that various modifications, changes, additions, deletions, and revisions of the invention may be made without deviating from the spirit and scope of the invention. Accordingly, the invention is not limited except as by the scope of the claims.

What is claimed is:

1. A method of forming a pattern on a layer of material on a substrate, comprising:

providing a plurality of spheres, each sphere of said plurality of spheres comprising a sphere having a substantially single material composition;

covering the layer on the substrate with the plurality of spheres to form a mask;

reducing a diameter of at least one sphere of the plurality of spheres using an etching process; and etching the layer on the substrate using the at least one sphere having a reduced diameter as a mask.

2. The method of claim 1, further comprising:

etching the substrate.

3. The method of claim 1, wherein the plurality of spheres includes a plurality of polystyrene spheres.

4. The method of claim 1, wherein the plurality of spheres includes a plurality of latex spheres.

5. The method of claim 1, wherein the layer on the substrate includes silicon dioxide.

6. The method of claim 1, wherein the substrate includes silicon.

7. The method of claim 1, wherein each sphere of the plurality of spheres has a nominal diameter of two microns before reducing the diameter of the at least one sphere thereof.

8. The method of claim 1, wherein reducing the diameter of the at least one sphere of the plurality of spheres includes reducing the diameter of the at least one sphere at least twenty-five percent thereof.

9. The method of claim 1, wherein reducing the diameter of the at least one sphere of the plurality of spheres includes reducing the diameter of the at least one sphere at least fifty percent thereof.

10. The method of claim 1, wherein etching the layer on the substrate using the at least one sphere having a reduced diameter as a mask includes an anisotropic etching process.

11. The method of claim 2, wherein etching the substrate includes an isotropic etching process.

12. The method of claim 2, wherein:

etching the layer on the substrate using the at least one sphere having a reduced diameter as a mask includes an anisotropic etching process; and etching the substrate includes an isotropic etching process.

13. The method of claim 1, further comprising:

removing the plurality of spheres from the layer on the substrate after the etching thereof.

14. The method of claim 2, further comprising:

removing portions of the layer on the substrate after etching the substrate.

15. The method of claim 1, wherein etching the layer on the substrate forms a plurality of substantially circular islands in the layer.

16. The method of claim 15, wherein etching the layer on the substrate forms substantially vertical sidewalls on the substantially circular islands in the layer.

17. The method of claim 2, wherein etching the substrate includes forming at least one micro-cathode in the substrate.

18. The method of claim 2, wherein etching the substrate includes forming a plurality of micro-cathodes in the substrate.

19. The method of claim 2, wherein etching the substrate includes forming a plurality of micro-cathodes in the substrate, at least one micro-cathode of the plurality of micro-cathodes located at a distance from another micro-cathode substantially equal to the reduced diameter of the at least one sphere of the plurality of spheres.

20. A method of forming a pattern in a layer of material on a substrate, comprising:

providing a plurality of spheres, each sphere of said plurality of spheres comprising a sphere having a substantially single material composition;

covering the layer on the substrate with the plurality of spheres to form a mask;

reducing a diameter of at least one sphere of the plurality of spheres using an etching process;

etching the layer on the substrate using the at least one sphere having a reduced diameter as a mask; and etching the substrate.

21. The method of claim 20, further comprising:

removing the plurality of spheres from the layer on the substrate after the etching thereof.

22. The method of claim 21, further comprising:

removing portions of the layer on the substrate after etching the substrate.

23. The method of claim 20, wherein etching the layer on the substrate using the at least one sphere having a reduced diameter as a mask includes an anisotropic etching process.

24. The method of claim 20, wherein etching the substrate includes an isotropic etching process.

25. The method of claim 20, wherein:

etching the layer on the substrate using the at least one sphere having a reduced diameter as a mask includes an anisotropic etching process; and etching the substrate includes an isotropic etching process.

26. The method of claim 20, wherein etching the layer on the substrate forms a plurality of substantially circular islands in the layer.

27. The method of claim 26, wherein etching the layer on the substrate forms substantially vertical sidewalls on the substantially circular islands in the layer.

28. The method of claim 20, wherein etching the substrate includes forming at least one micro-cathode in the substrate.

29. The method of claim 20, wherein etching the substrate includes forming a plurality of micro-cathodes in the substrate.

30. The method of claim 20, wherein etching the substrate includes forming a plurality of micro-cathodes in the substrate, at least one micro-cathode of the plurality of micro-cathodes located at a distance from another micro-cathode substantially equal to the reduced diameter of the at least one sphere of the plurality of spheres.

31. The method of claim 20, wherein covering the layer on the substrate with the plurality of spheres to form a mask includes a monolayer of a plurality of spheres.

32. A method of forming a plurality of micro-cathodes for a field emission display, comprising:

providing a substrate having a layer thereon;

providing a plurality of spheres, each sphere of said plurality of spheres comprising a sphere having a substantially single material composition;

covering the layer on the substrate with the plurality of spheres to form a mask;

reducing a diameter of at least one sphere of the plurality of spheres using an etching process;

etching the layer on the substrate using the at least one sphere having a reduced diameter as a mask, the etching of the layer on the substrate forming at least one island therein; and etching the substrate to form at least one micro-cathode therein.

33. The method of claim 32, further comprising:

removing the plurality of spheres from the layer on the substrate after the etching thereof.

34. The method of claim 33, further comprising:

removing the at least one island of the layer on the substrate after etching the substrate.

35. The method of claim 32, wherein etching the layer on the substrate using the at least one sphere having a reduced diameter as a mask includes an anisotropic etching process.

36. The method of claim 32, wherein etching the substrate includes an isotropic etching process.

37. The method of claim 32, wherein:

etching the layer on the substrate using the at least one sphere having a reduced diameter as a mask includes an anisotropic etching process; and etching the substrate includes an isotropic etching process.

38. The method of claim 32, wherein etching the layer on the substrate forms a plurality of substantially circular islands in the layer.

39. The method of claim 38, wherein etching the layer on the substrate forms substantially vertical sidewalls on the substantially circular islands in the layer.

40. The method of claim 32, wherein etching the substrate includes forming at least one micro-cathode in the substrate.

41. The method of claim 32, wherein etching the substrate includes forming a plurality of micro-cathodes in the substrate.

42. The method of claim 32, wherein etching the substrate includes forming a plurality of micro-cathodes in the substrate, at least one micro-cathode of the plurality of micro-cathodes located at a distance from another micro-cathode substantially equal to the reduced diameter of the at least one sphere of the plurality of spheres.

43. The method of claim 32, wherein the plurality of spheres includes microspheres.

44. The method of claim 32, wherein the plurality of spheres includes nanospheres.

* * * * *

UNITED STATES PATENT AND TRADEMARK OFFICE

CERTIFICATE OF CORRECTION

PATENT NO. : 6,350,388 B1 Page 1 of 1
DATED : February 26, 2002
INVENTOR(S) : Eric J. Knappenberger and Aaron R. Wilson It is certified that error appears in the above-identified patent and that said Letters Patent is hereby corrected as shown below:

Column 1,
Line 59, change "large-areas" to -- large areas --

Column 4,
Line 36, change "emission structures 13" to -- 13 emission structures --

Signed and Sealed this

Fifth Day of August, 2003

JAMES E. ROGAN
*Director of the United States Patent and Trademark Office*